United States Patent [19]

Hoppe et al.

[11] Patent Number: 5,637,858

[45] Date of Patent: Jun. 10, 1997

[54] METHOD FOR PRODUCING IDENTITY CARDS

[75] Inventors: Joachim Hoppe; Arno Hohmann, both of Munich, Germany

[73] Assignee: Giesecke & Devrient GmbH, Munich, Germany

[21] Appl. No.: 361,727

[22] Filed: Dec. 23, 1994

[30] Foreign Application Priority Data

Dec. 23, 1993 [DE] Germany .................. 43 44 297.8

[51] Int. Cl.⁶ .................................................. G06K 19/06
[52] U.S. Cl. ........................ 235/492; 257/679; 29/827; 29/840
[58] Field of Search .......................... 235/487, 492; 257/679; 29/827, 840, 843

[56] References Cited

U.S. PATENT DOCUMENTS

| | | | |
|---|---|---|---|
| 4,222,516 | 9/1980 | Badet et al. | 235/492 |
| 4,457,798 | 7/1984 | Hoppe et al. | |
| 4,460,825 | 7/1984 | Haghiri-Tehrami | 235/492 |
| 4,714,980 | 12/1987 | Hara | 235/492 |
| 4,727,246 | 2/1988 | Hara et al. | 235/492 |
| 4,746,392 | 5/1988 | Hoppe | 29/827 |
| 4,835,846 | 6/1989 | Juan et al. | 29/840 |
| 4,889,980 | 12/1989 | Hara et al. | 235/492 |
| 4,910,582 | 3/1990 | Miyamoto | 235/492 |
| 4,994,659 | 2/1991 | Yabe et al. | 235/492 |
| 5,005,282 | 4/1991 | Rose | 29/827 |
| 5,055,913 | 10/1991 | Haghiri-Tehrani | 257/676 |
| 5,057,679 | 10/1991 | Audic et al. | 235/492 |
| 5,252,167 | 10/1993 | Hoppe et al. | 156/261 |
| 5,255,430 | 10/1993 | Tallaksen | 29/827 |

FOREIGN PATENT DOCUMENTS

| | | | |
|---|---|---|---|
| 0493738A1 | 7/1992 | European Pat. Off. | |
| 59-228743 | 12/1984 | Japan | 257/679 |

Primary Examiner—Donald T. Hajec
Assistant Examiner—Mark Tremblay
Attorney, Agent, or Firm—Hazel & Thomas

[57] ABSTRACT

A method for producing identity cards which uses card bodies with standardized outer dimensions and wherein carrier elements with different dimensions are incorporated in the card bodies, the carrier elements having at least one integrated circuit connected electroconductively with coupling elements used for communication of the integrated circuit with external devices, characterized in that adapter elements formed with uniform outer dimensions are provided for receiving the different carrier elements, for receiving the adapter elements the card bodies are provided with recesses corresponding in shape and size substantially to the outer dimensions of the adapter elements, and the carrier elements are connected with the card body via the adapter elements.

14 Claims, 5 Drawing Sheets

METHOD FOR PRODUCING IDENTITY CARDS

BACKGROUND OF THE INVENTION

1. Field of the Invention

The present invention relates to a method for producing identity cards. The invention also relates to an identity card.

2. Description of the Prior Art

Identity cards with integrated circuits are used increasingly in the form of credit cards, bank cards, cash cards and the like in a great variety of services sectors, for example in cashless money transfer and in the in-company area. A large number of identity cards are produced by the so-called "mounting technique". In this method a card body with a recess is prepared in which the integrated circuit is incorporated by means of a carrier element and fastened for example by means of an adhesive layer.

DE-A 31 22 981 discloses e.g. a method for producing an identity card with a penny-like carrier element. First a card body comprising a core layer and front and back cover layers is provided. The card body is prepared by the laminating technique and has no recess yet. Between the core layer and the back cover layer there is a separation layer in certain areas that prevents the core layer from bonding with the back cover layer during lamination. The separation layer is utilized to stamp a penny-like plug out of the finished card body and to remove it so as to create a blind hole-shaped recess in the card body. In the recess the penny-like carrier element is connected all over the bottom of the recess by means of an adhesive layer. The dimensions of the recess correspond to the shape and size of the carrier element.

EP-A10 493 738 discloses for example a method for producing an identity card with a carrier element. The carrier element has at least one integrated circuit connected electroconductively via connecting elements with coupling elements used for communication of the integrated circuit with external devices. The integrated circuit and the electroconductive connecting elements are cast with a casting compound. The carrier element is glued into a specially provided two-step recess in the card body with the aid of a thermally activated adhesive layer. The dimensions of the two-step recess are selected so as to correspond to the shape and size of the carrier element.

The stated publications show that the dimensions of the recess correspond exactly to the shape and size of the particular carrier element to be inserted in the recess, the carrier elements being connected directly with the card bodies by means of an adhesive layer.

Since different recesses must be produced in the card bodies for carrier elements with different integrated circuits varying in size and shape, a tool specially adapted to the shape and size of the carrier element to be used must be provided for producing the card recess. For example a special injection mold is required for producing the recess if the card body is produced by injection molding. Furthermore the stock keeping of card bodies with different recesses is difficult since one cannot foresee whether the shape and size of the integrated circuits to be used will change, resulting in useless remaining stock of card bodies with special recesses. Also, the different recesses in the card bodies make it difficult to change over easily in the production of identity cards with differently shaped carrier elements, since neither the necessary tools for producing the special recesses in the card bodies nor corresponding stock in store are available. Finally high costs can arise for small series of identity cards with a special carrier element, since the recess in the card body must be prepared separately with a special tool.

All this means that the production of a special recess adapted to the dimensions of the carrier element impairs the flexibility in producing identity cards with different carrier elements. Also, the direct connection of the carrier elements with the card body by means of an adhesive layer has the disadvantage that it results in a relatively rigid compound of the carrier element and card body that leads to high mechanical loads on the integrated circuit and electric link conductors when there is bending stress on the card.

SUMMARY OF THE INVENTION

The invention is thus based on the problem of improving the production of identity cards with respect to the incorporation of different carrier elements with integrated circuits in the card bodies.

The basic idea of the invention is to provide the card bodies of the identity cards with a uniform recess independently of the shape and size of the integrated circuits to be inserted in the identity cards, and to provide flexible adapter elements for receiving the different integrated circuits, the outer dimensions of said adapter elements being adapted to the shape and size of the standardized recess in the card bodies.

For receiving the carrier elements the adapter elements may be provided with openings that correspond in shape and size substantially to the outer dimensions of the particular carrier element being used. The adapter elements formed with uniform outer dimensions may thus also be used for incorporating different carrier elements in the uniform recess in the card bodies.

The advantages obtained with the invention consist particularly in that the production of identity cards with different carrier elements may be designed flexibly by the use of a standardized starting product with a uniform card recess in conjunction with an adapter element. This makes it possible to produce and store prefabricated card bodies with recesses in any desired piece numbers since they may be used independently of the carrier element to be incorporated. Furthermore the providing of card bodies with uniform recesses and the corresponding adapter elements makes it unnecessary to provide special tools, so that the production cost of the identity cards may ultimately be lowered, in particular for small series. Furthermore the standardized recess in the card bodies may have a simple shape so that it may be prepared economically with low tolerance dependencies in a simple way. The abovementioned advantages are obtained without quality losses during the production of identity cards.

According to a preferred embodiment example of the invention the carrier element is connected with the adapter element to form a module corresponding in shape and size substantially to the dimensions of the standardized recess in the card body. The resulting module comprising carrier element and adapter element is fastened in the recess of the card body with the aid of an adhesive layer. In this embodiment example the adapter element is an integrated part of the electronic module. However it is also possible to glue the adapter element into the standardized recess in the card body first as a separate element, thereby creating a recess in the card body adapted to the shape and size of the particular carrier element to be inserted. The carrier element may then be connected with the adapter element e.g. by an adhesive layer.

The material for the adapter element may be selected independently of the materials used for producing the carrier element, which must meet certain requirements. For the adapter element one preferably selects an elastic or plastically very deformable material, for example soft PVC foam, polyethylene foam or elastomer foam. By using an elastic, very deformable material for the adapter element one relieves the integrated circuit and electroconductive connecting elements from the circuit to the contact surfaces during production of the identity card. Also, the elastic buffer effect of the adapter element relieves the integrated circuit together with the conductor wires when there is bending stress on the card in daily use, thereby ensuring high electric reliability of the identity card. Relief of the integrated circuit from bending stress with the aid of the adapter element is also possible since the latter is connected with the card body only partly, i.e. in articulated fashion.

Other objects and features of the present invention will be apparent from the following detailed description of the preferred embodiment.

BRIEF DESCRIPTION OF THE DRAWINGS

The invention will be further described in conjunction with the accompanying drawings, in which:

FIG. 1 shows identity card 1 with electronic module 3 in a plan view. Electronic module 3 has coupling elements 5 used for communication with external devices.

FIG. 2 shows a greatly enlarged cross section, not true to scale, along broken line A—A through identity card 1 in FIG. 1. Card body 7 has standardized recess 9 that always has the same shape and size independently of the shape and dimensions of the carrier element to be inserted in the recess. Card body 7 with uniform recess 9 may be prepared by a great variety of techniques, e.g. injection molding, whereby the recess may already be taken into consideration during the injection molding operation by means of a corresponding casting mold, or the recess may be milled into the finished card body later. It is of course also possible to produce the card body by the laminating technique, and to make the recess in the card body by stamping or else milling. The above list does not lay claim to completeness; the expert is familiar with further techniques for producing a card body with a recess.

Figure 1:
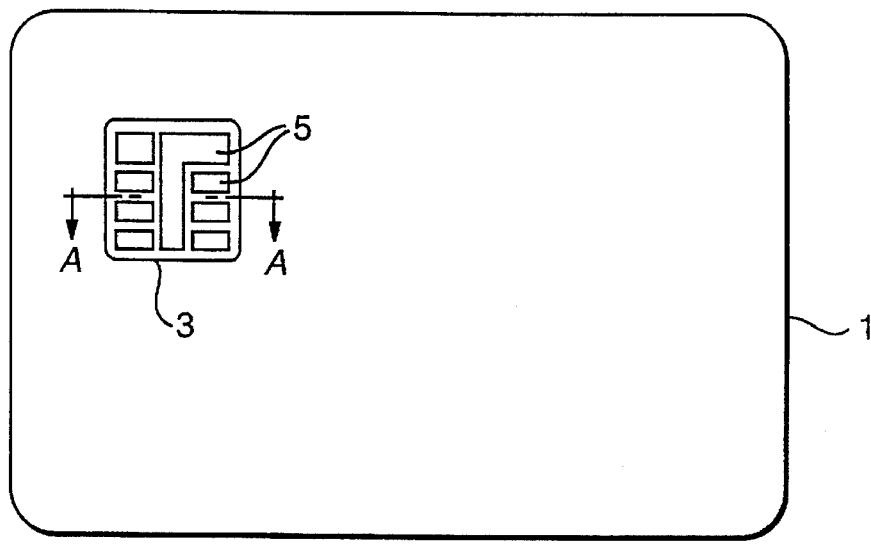
FIG. 1 shows the plan view of an identity card with an electronic module.

In standardized recess 9 carrier element 4 is connected with the card body with the aid of adapter element 25. Carrier element 4 shown in FIG. 2 consists e.g. of carrier film 11 made of Kapton having contact surfaces 5 on one side. Carrier film 11 has accordingly positioned windows 15 for receiving integrated circuit 17 and guiding through electroconductive connecting elements 19 from circuit 17 to contact surfaces 5. For protection from mechanical loads the integrated circuit and electroconductive connecting elements are cast with casting compound 21. The carrier element is connected with adapter element 25 e.g. by adhesive layer 22. The adapter element shown in FIG. 2 has e.g. two-step opening 26, whereby shoulder portions 27 of the opening substantially receive carrier film 11 and deeper part 28 of the opening substantially receives casting compound 21. Adhesive layer 22 glues the part of the carrier element free from casting compound to the shoulder portions of the adapter element. The adapter element may in turn be connected with the card body by means of adhesive layer 29 on the bottom of standardized recess 9 in said card body.

Figure 2:
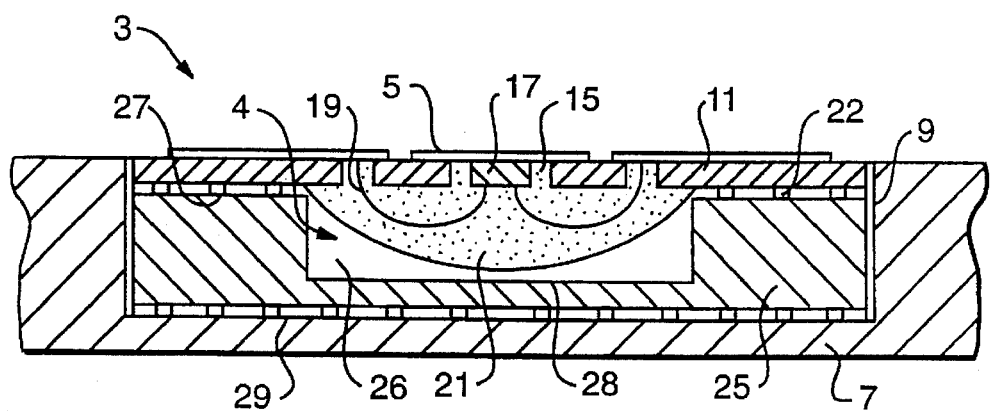
FIGS. 2 to 4 show various embodiment examples of an identity card each in cross section.
Figure 3:
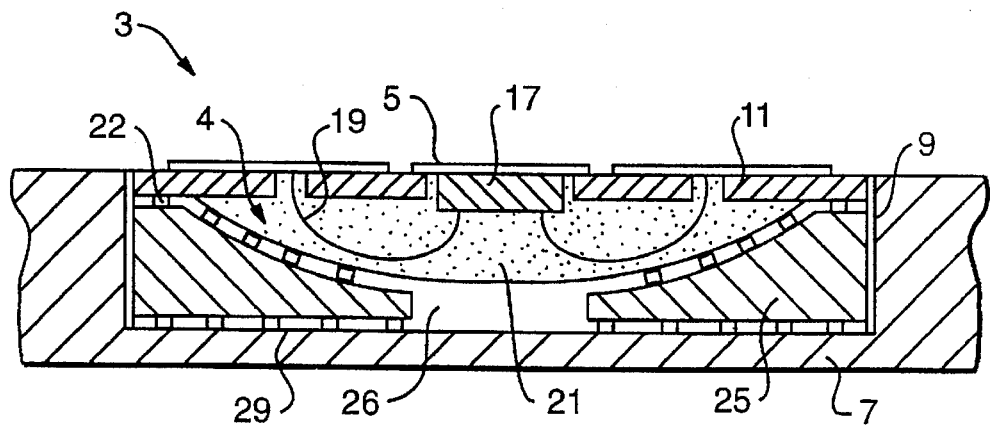

In the card shown in FIG. 3, carrier element 4 differs from that shown in FIG. 2 since integrated circuit 17 is clearly larger, so that the extent of casting compound 21 and thus the outer shape and size of carrier element 4 are also different. Despite these differences the carrier element may be inserted in standardized recess 9 of card body 7 with the aid of adapter element 25 adapted to the dimensions of carrier element 4 and provided e.g. with corresponding opening 26 for receiving the carrier element. Opening 26 of the adapter element shown in FIG. 3 is formed in such a way that not only the part of the carrier element which is free from casting compound 21 but also at least part of the casting compound may be connected with the adapter element with the aid of adhesive layer 22. This permits a good bond between the carrier element and the adapter element even when the part of the carrier element free from casting compound constitutes a relatively small surface, as in the example shown. The adapter element may in turn be connected with the bottom of standardized recess 9 in the card body e.g. by means of adhesive layer 29.

Figure 4:
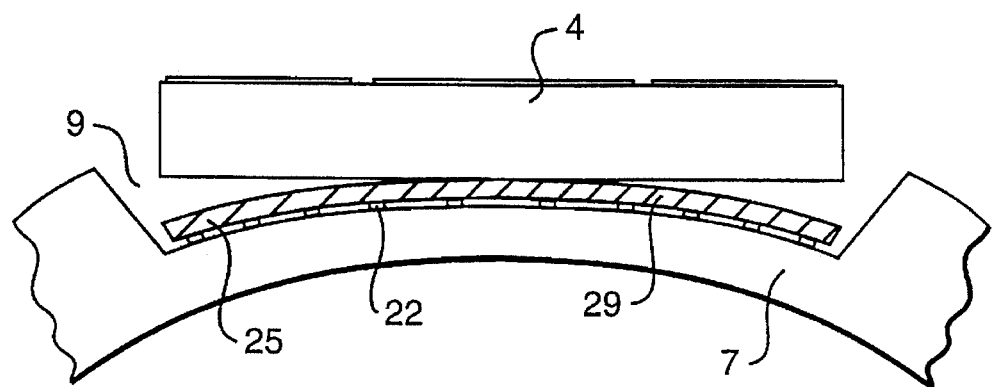

FIG. 4 shows very schematically an identity card under bending stress, carrier element 4 being connected with card body 7 in recess 9 in articulated fashion with the aid of adapter element 25. The carrier element is formed by very large chip 4 in this embodiment example. The adapter element is connected all over with the bottom of the recess in the card body. The connection with the card body may be effected e.g. by means of contact adhesive layer 29 located on the adapter element. On the side facing the carrier element the adapter element is connected with the chip only partially, e.g. in the middle area, in order to obtain the articulated connection with the chip. This articulated connection may be realized in the middle area by means of a thermally activated adhesive layer disposed on the adapter element. The connection of adapter element 25 with chip 4 to form a module is preferably effected during the semifinished product fabrication of the module, i.e. before the module is incorporated in the card body. The articulated connection of the chip with the adapter element obtains effective relief of the chip when there are high bending stresses on the card. The embodiment of the adapter element shown here is advantageous in particular with large chips. Due to the buffer effect produced by the adapter element, which consists e.g. of a PET film, no point-shaped deformations may arise on the thin-walled card bottom, e.g. from gluing points.

Figure 5:
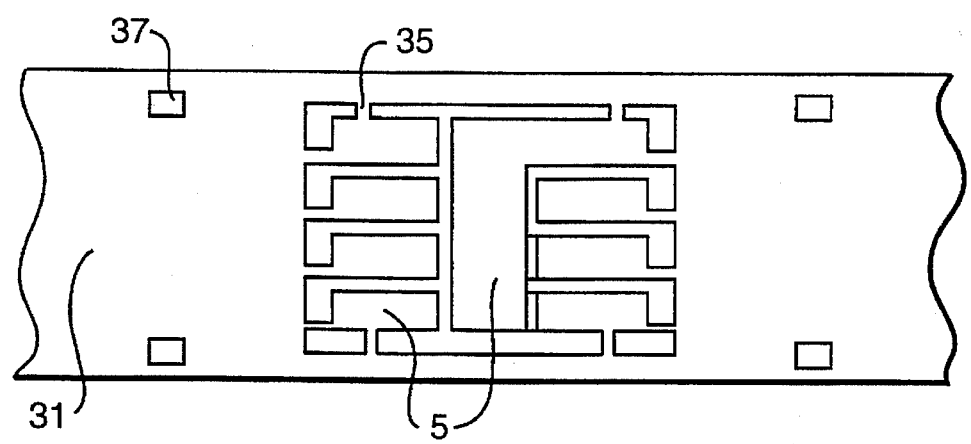
FIG. 5 shows a metal band with a prestamped contact layout.

FIG. 5 shows a plan view of metal band 31 with suitably prestamped contact surfaces 5, as may be used for producing the standardized electronic modules by the lead frame technique. Contact surfaces 5 of the metal band, which has e.g. a thickness of about 50 to 100 microns, are first connected with the metal band via bars 35. The connecting bars are later severed when the individual electronic modules are stamped out. The metal band may have perforations 37 for clocked transport, like all bands shown in the following.

Figure 6:
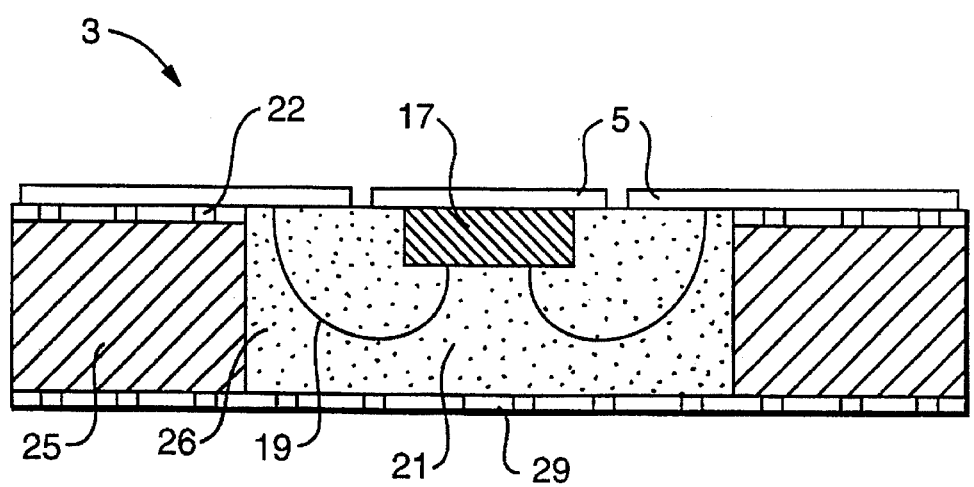
FIG. 6 shows an electronic module in cross section.

FIG. 6 shows an electronic module in cross section. Adapter element 25 is provided here e.g. with through opening 26 of constant diameter. The through opening is dimensioned so that there is room for constantly thick casting compound 21 of the carrier element completely within the opening of the adapter element. The form of the casting compound shown here thus permits simple production of the opening of the adapter element. Contact surfaces 5 of electronic module 3 are obtained in this embodiment example e.g. by being suitably stamped out of a metal band, as shown in FIG. 5, by the lead frame technique. Integrated circuit 17 is glued by means of an electroconductive adhesive to a central area of the contact surfaces. This central contact area may be used as a connection to ground. This technique has the advantage that no separate carrier film is needed for receiving the contact surfaces and the integrated circuit, as shown in FIGS. 2 and 3. Finally it should be mentioned that the design of the electronic module according to FIG. 6 is selected only by way of example. The electronic module may of course also be constructed differently, but the standardized outer dimensions of the module are maintained to permit simple production of the recess in the card body adapted to the outer dimensions of the module.

Figure 7A:
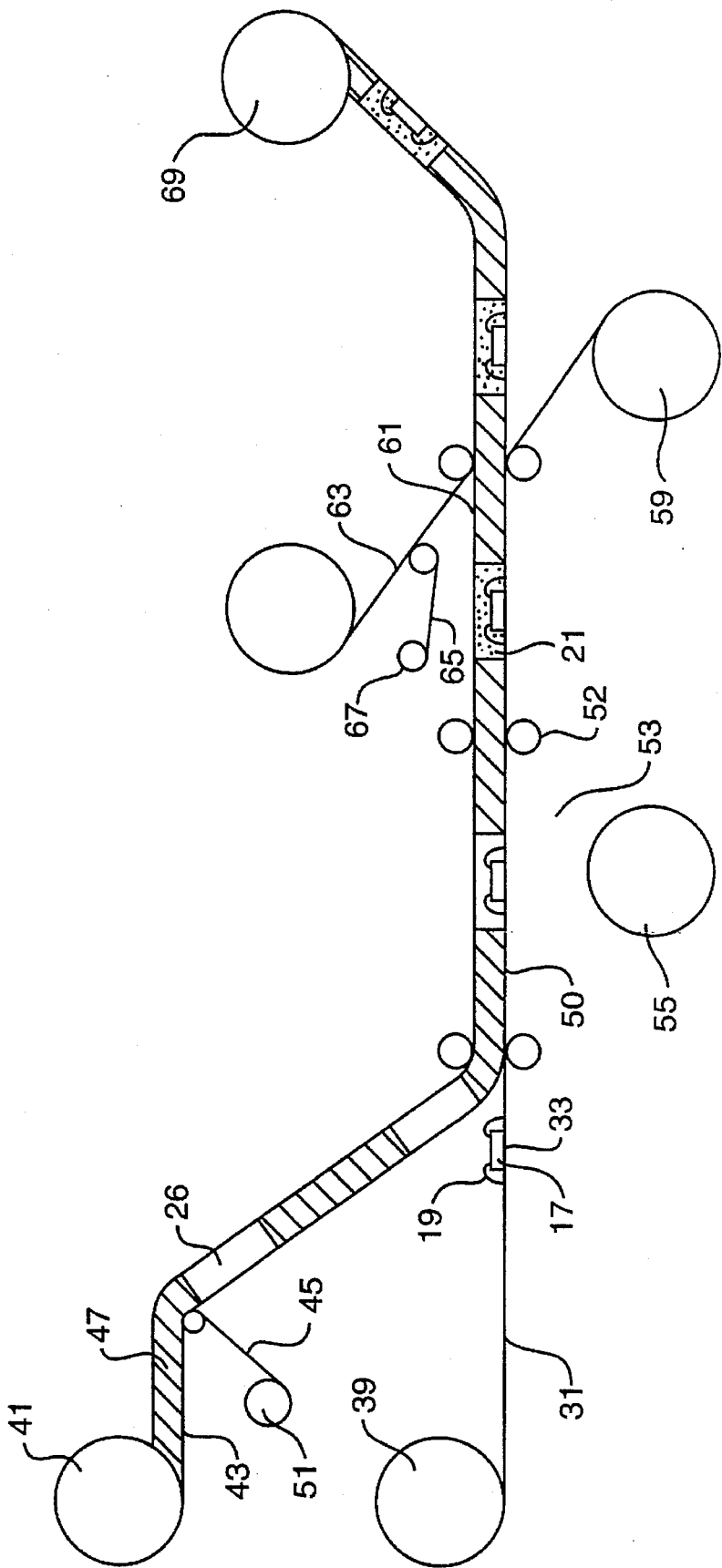
FIGS. 7a and 7b show the semifinished product fabrication of electronic modules.
Figure 7B:
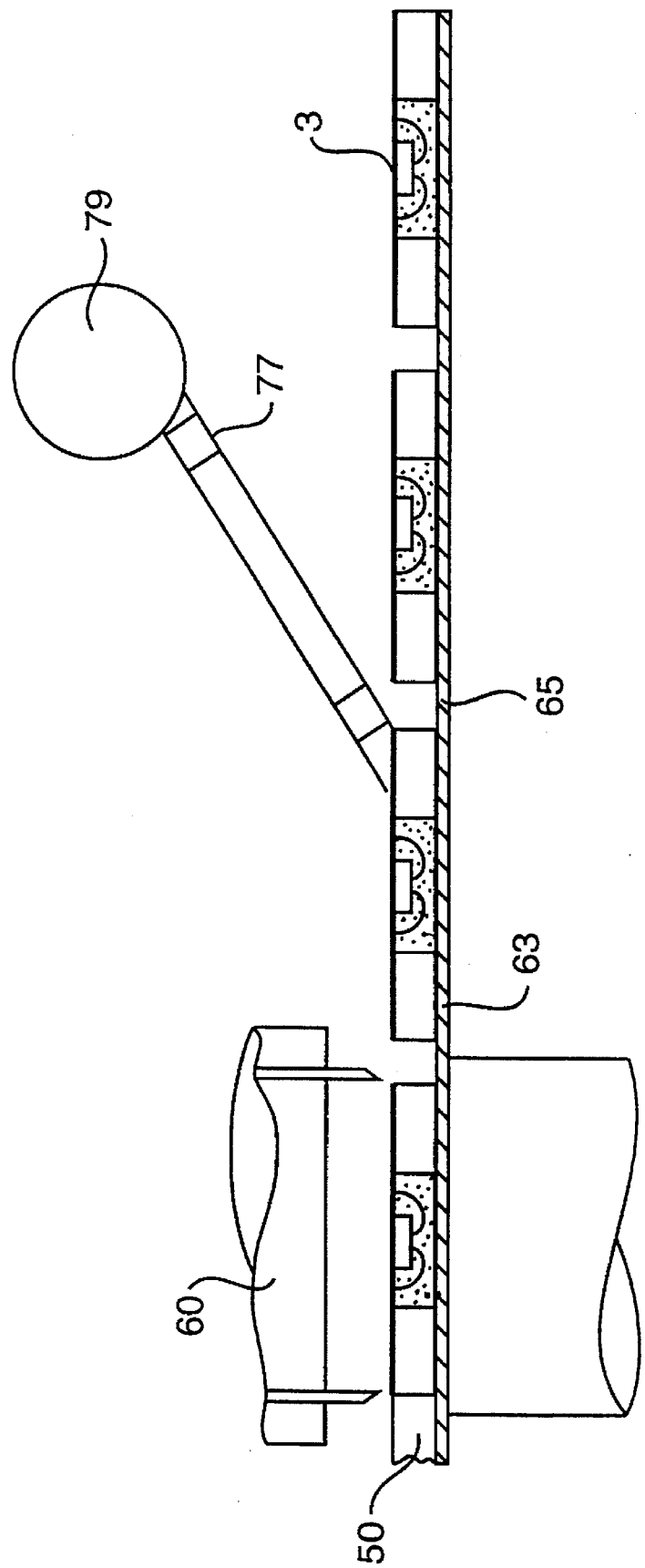

FIGS. 7a and 7b show schematically an embodiment example for the semifinished product fabrication of electronic modules. Metal band 31, in which the contact layout shown in FIG. 5 is prestamped with a stamping die not shown, is wound off roll 39. In a further processing unit likewise not shown, integrated circuit 17 is applied to a central area of contact surfaces 5 and connected conductively with the contact surfaces by electroconductive connecting elements 19. Parallel to the abovementioned method steps, flexible band 47 fed in the form of endless material, from which adapter elements 25 are prepared, is unwound from roll 43. For producing the adapter elements the band may be provided on at least one side 43 with an adhesive layer covered by protective film 45. The flexible band fed in the form of endless material may be provided with openings 26 which are produced by means of a processing unit not shown, for example by stamping, boring or other techniques. Protective film 45 is removed from the flexible band provided with openings and wound onto roll 51. Metal band 31 provided with integrated circuits 17 is brought together with the band provided with openings 26 in such a way that at least integrated circuits 17 and electroconductive connecting elements 19 lie within openings 26. The flexible band is glued to the metal band by means of an adhesive layer located on side 43. Resulting compound 50 may then be brought together and lightly glued on bottom side 52 with lightly adhesive band 53 which is wound off roll 55. Band 53 covers the side of the metal band opposite the integrated circuits in such a way that integrated circuits 17 and electroconductive connecting elements 19 may be cast with casting compound 21 in a processing unit not shown, without the casting compound being able to flow through the interruptions in the contact layout of contact surfaces 5 onto the latter. During casting the walls of openings 26 serve as a limiting frame for the casting compound so as to prevent the casting compound from flowing off laterally. After this method step band 53 may removed from compound 50 again and wound onto roll 59. Finally compound 50 may be provided on upper side 61 with two-side adhesive strip 63, from one side of which protective film 65 is removed beforehand and wound onto roll 67 so that adhesive strip 63 may be glued to the compound. The other side of the adhesive strip is still provided with a protective film. Compound 50 now finished may be wound onto roll 69 or else immediately processed further.

FIG. 7b shows the further processing of compound 50 to individual electronic modules which are incorporated in the recesses in the card bodies. In first unit 60 the contour of individual electronic modules 3 is stamped from compound 50. The stamping takes place here in such a way that the connecting bars shown in FIG. 5 and adhesive strip 63 are severed in accordance with the desired contour of the electronic modules but protective film 65 is not severed. Grid 77 remaining after the stamping operation may be wound onto roll 79 so that only individual modules 3 remain on the protective film.

Finally it should be mentioned that, instead of the metal band shown, one may also provide a band already equipped with integrated circuits. As the carrier film for the already wired and cast integrated circuits one may of course also use Kapton. The integrated circuits and the electroconductive connections are preferably surrounded by a casting compound for better protection, but the casting of the integrated circuits and electroconductive connections is not absolutely necessary.

Figure 8:
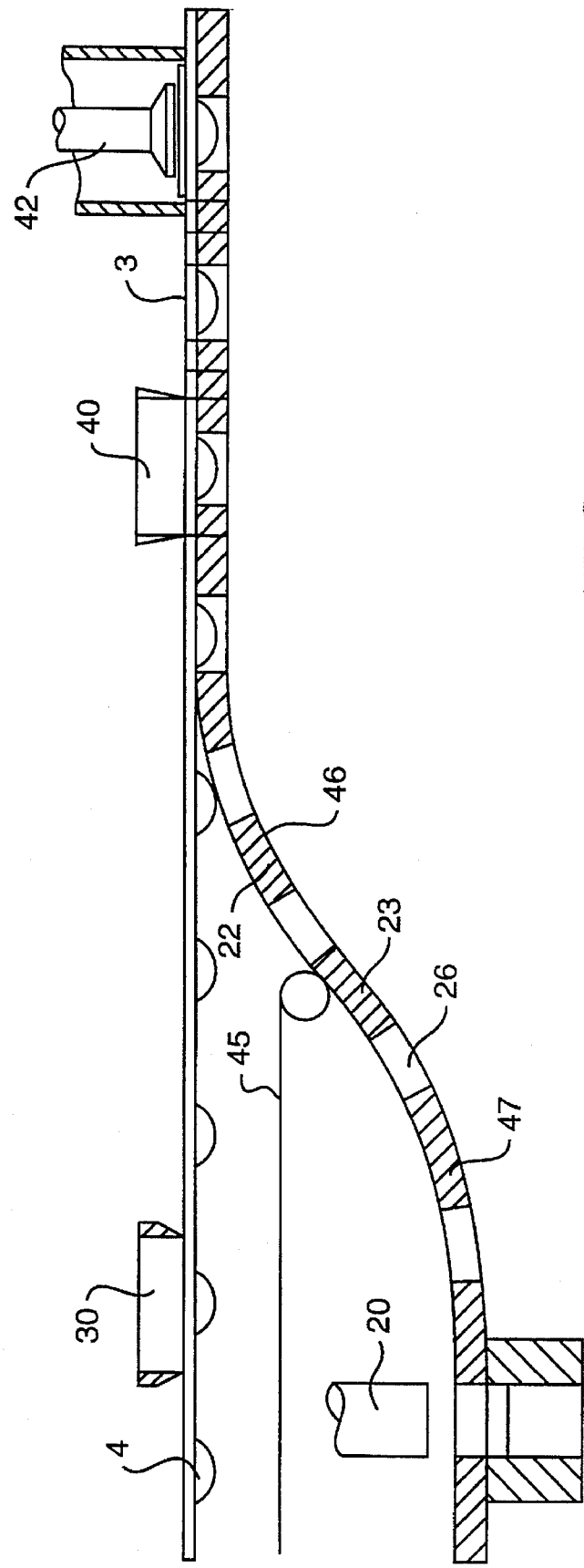
FIG. 8 shows a method for producing identity cards.

FIG. 8 shows schematically a method for producing identity cards. Flexible band 47 fed in the form of endless material is provided with openings 26 in stamping unit 20 and connected, after removal of upper protective film 45, by means of adhesive layer 22 with carrier elements 4 fed in the form of endless material. In stamping unit 30 the desired module contour is prestamped. This prestamping permits the carrier elements to be stamped out more easily with the adapter elements subsequently in stamping unit 40, whereby the latter are then surrounded only by a stamping grid. Bottom protective film 46 of the flexible band is not stamped at the same time. Stamped-out electronic modules 3 comprising carrier element and adapter element may then be removed from this protective film by means of vacuum gripper 42 and inserted in the card recess. The electronic modules may be removed directly by the vacuum gripper from the stamping grid, thereby e.g. exposing a further adhesive layer of the flexible band by means of which the modules may then be incorporated in the card recess. However it is also possible first to remove the stamping grid from protective film 46 and wind it onto a roll not shown, and then to remove the electronic modules remaining on protective film 46 at regular intervals and incorporate them in the card recesses.

To enlarge the adhesive surfaces, as shown e.g. in FIG. 3, the adapter element may also be preformed in accordance with the dimensions of the cast integrated circuits in a unit not shown and then provided with a through hole smaller than the cast integrated circuits. This has the advantage that the cast integrated circuit is exposed to no mechanical overstressing during assembly.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A method for producing identity cards comprising the steps of:

forming a card body having a predetermined recess therein;

forming a carrier element, said carrier element comprising at least one integrated circuit and electroconductive connections;

forming an adapter element having outer dimensions corresponding to said recess;

inserting said adapter element into said recess in said card body and connecting at least partly to said card body using an adhesive; and inserting and connecting said carrier element to said adapter element using an adhesive.

2. A method for producing identity cards comprising the steps of:

forming a card body having a predetermined recess therein;

forming a carrier element, said carrier element comprising at least one integrated circuit and electroconductive connections;

forming an adapter element having outer dimensions corresponding to said recess;

attaching said carrier element to said adapter element by means of an adhesive to form an electronic module; and incorporating said module in said recess in said card body using an adhesive in such a way that said module is connected at least partly to said card body.

3. The method recited in claim 2 wherein said carrier element is provided in the form of an endless material; a flexible band is fed in said form of endless material from which said adapter element is prepared; said flexible band is provided at regular intervals with openings for receiving said carrier elements; said band provided with openings which are brought together with said carrier elements positioned in such a way that said integrated circuits and electroconductive connects lie completely within said openings of said band; said carrier elements are glued to said flexible band to form a compound; and said electronic modules are then stamped out of said compound.

4. The method recited in claim 3 wherein said stamped-out modules are removed with the aid of a vacuum gripper and incorporated in said recesses in said card bodies by means of an adhesive layer.

5. The method recited in claim 3 wherein a metal band is provided as an endless material for said carrier elements.

6. The method recited in claim 5 wherein a contact layer intended for contact surfaces of said electronic modules is prestamped from said metal band, said contact surfaces first remaining connected with said metal band via bars; said integrated circuits are glued electroconductively to respective central areas of said contact surfaces and connected electroconductively with said contact surfaces; said metal band and said flexible band are glued to form a compound; said compound is provided with stampings at regular intervals in accordance with the contour of said electronic modules in such a way that remaining ones of said bars of said metal band and said flexible band are severed so as to form individual electronic modules surrounded by a stamping grid.

7. The method recited in claim 6 wherein said compound is provided, before stamping, with a protective film on said contact surface side and said integrated circuits and electroconductive connections are cast with a casting compound, said contact surface side of said modules being covered by said protective film during casting.

8. An identity card having a card body and comprising:

a carrier element which is disposed in a recess in said card body of said identity card, wherein said carrier element includes at least one integrated circuit connected electroconductively via connecting elements with coupling elements which are used for communication of said integrated circuit with external devices; and an adapter element having two main surfaces, wherein one of said main surfaces of said adapter element is connected to a bottom of said recess in said card body and the other main surface of said adapter element is connected at least partly to said carrier element, respectively, using an adhesive.

9. The identity card recited in claim 8 wherein said adhesive layers are selected from the group consisting of contact adhesives and thermally activated adhesives.

10. The identity card recited in claim 8 wherein said adapter element is glued to said carrier element only in a middle area of said adapter element.

11. The identity card recited in claim 10 wherein said integrated circuit and electroconductive connecting elements of said carrier element are surrounded by a casting compound connected at least partly with said adapter element.

12. The identity card recited in claim 11 wherein main surfaces of said adapter elements are formed asymmetrically.

13. The identity card recited in claim 8, wherein said adapter element consists of a material that is at least one of elastically and plastically deformable.

14. The identity card recited in claim 13 wherein said adapter element consists of a material selected from the group consisting of a soft PVC foam, a polyethylene foam, an elastomer foam and a polyethylene film.

* * * * *